(12) United States Patent
Jee et al.

(10) Patent No.: US 8,987,586 B2
(45) Date of Patent: *Mar. 24, 2015

(54) CONDUCTIVE PASTE AND ELECTRONIC DEVICE AND SOLAR CELL INCLUDING AN ELECTRODE FORMED USING THE CONDUCTIVE PASTE

(75) Inventors: Sang-Soo Jee, Hwaseong-si (KR); Eun-Sung Lee, Seoul (KR); Se-Yun Kim, Seoul (KR); Sang-Mock Lee, Yongin-si (KR); Jun Ho Lee, Seoul (KR); Do-Hyang Kim, Seoul (KR); Ka Ram Lim, Seoul (KR)

(73) Assignee: Samsung Electronics Co., Ltd. (KR)

( * ) Notice: Subject to any disclaimer, the term of this patent is extended or adjusted under 35 U.S.C. 154(b) by 584 days.

This patent is subject to a terminal disclaimer.

(21) Appl. No.: 13/206,880

(22) Filed: Aug. 10, 2011

(65) Prior Publication Data

US 2012/0037220 A1     Feb. 16, 2012

(30) Foreign Application Priority Data

Aug. 13, 2010  (KR) .......... 10-2010-0078343
Jul. 27, 2011    (KR) .......... 10-2011-0074689

(51) Int. Cl.
*H01L 31/00*    (2006.01)
*C22C 16/00*    (2006.01)
(Continued)

(52) U.S. Cl.
CPC .......... *H01B 1/22* (2013.01); *H01L 31/022425* (2013.01); *H01L 31/022441* (2013.01); *H01L 31/0682* (2013.01); *Y02E 10/547* (2013.01)
USPC ........... 136/256; 257/751; 252/512; 252/513; 252/514; 420/423; 420/587

(58) Field of Classification Search
CPC .............. H01B 1/22; H01L 31/022425; H01L 31/02241; H01L 31/0682
USPC ........... 136/256; 257/751; 252/512, 513, 514; 420/423, 587
See application file for complete search history.

(56) References Cited

U.S. PATENT DOCUMENTS 4,434,084 A   2/1984   Hicks et al.
4,962,066 A  10/1990   Starz
(Continued)

FOREIGN PATENT DOCUMENTS

CN     101055776 A    10/2007
CN     101186128 A     5/2008
(Continued)

OTHER PUBLICATIONS

Hilali et al., "Effect of glass frit chemistry on the physical and electrical properties of thick-film Ag contacts for silicon solar cells", Journal of Electronic Materials. vol. 35, Issue 11 , pp. 2041-2047 (2006). DOI: 10.1007/s11664-006-0311-x.*

(Continued)

*Primary Examiner* — Jonathan Johnson
*Assistant Examiner* — Angelo Trivisonno
(74) *Attorney, Agent, or Firm* — Harness, Dickey & Pierce, PLC (57) ABSTRACT

A conductive paste including a conductive powder, a metallic glass, and an organic vehicle, wherein the metallic glass has a resistivity that is decreased when the metallic glass is heat treated at a temperature that is higher than a glass transition temperature of the metallic glass.

29 Claims, 5 Drawing Sheets

(51) Int. Cl.

| | |
|---|---|
| C22C 27/00 | (2006.01) |
| C22C 30/02 | (2006.01) |
| H01B 1/02 | (2006.01) |
| H01L 23/48 | (2006.01) |
| H01L 23/52 | (2006.01) |
| H01L 29/40 | (2006.01) |
| H01B 1/22 | (2006.01) |
| H01L 31/0224 | (2006.01) |
| H01L 31/068 | (2012.01) |

(56) References Cited

U.S. PATENT DOCUMENTS

| | | | |
|---|---|---|---|
| 5,170,930 | A | 12/1992 | Dolbear et al. |
| 6,027,575 | A | 2/2000 | Paruchuri et al. |
| 6,420,067 | B1 | 7/2002 | Yoshioka |
| 7,056,394 | B2 | 6/2006 | Inoue et al. |
| 7,147,727 | B2 | 12/2006 | Kim et al. |
| 7,183,018 | B2 | 2/2007 | Kawakami et al. |
| 7,399,370 | B2 | 7/2008 | Inoue et al. |
| 7,947,134 | B2 | 5/2011 | Lohwongwatana et al. |
| 2002/0036034 | A1 | 3/2002 | Xing et al. |
| 2004/0245507 | A1 | 12/2004 | Nagai et al. |
| 2005/0019203 | A1 | 1/2005 | Saitoh et al. |
| 2005/0211340 | A1 | 9/2005 | Kim et al. |
| 2005/0228097 | A1 | 10/2005 | Zhong |
| 2006/0102228 | A1 | 5/2006 | Sridharan et al. |
| 2007/0031730 | A1 | 2/2007 | Kawakami et al. |
| 2007/0034305 | A1 | 2/2007 | Suh |
| 2007/0072969 | A1 | 3/2007 | Lee et al. |
| 2007/0102676 | A1 | 5/2007 | Lee et al. |
| 2007/0137737 | A1 | 6/2007 | Guo et al. |
| 2007/0157852 | A1 | 7/2007 | Lee et al. |
| 2008/0196794 | A1 | 8/2008 | Blandin et al. |
| 2008/0251164 | A1* | 10/2008 | Lohwongwatana et al. .. 148/528 |
| 2009/0056798 | A1 | 3/2009 | Merchant et al. |
| 2009/0101190 | A1 | 4/2009 | Salami et al. |
| 2009/0211626 | A1 | 8/2009 | Akimoto |
| 2009/0250106 | A1 | 10/2009 | Hayashi et al. |
| 2009/0298283 | A1* | 12/2009 | Akimoto et al. ............... 438/660 |
| 2010/0037990 | A1 | 2/2010 | Suh |
| 2010/0096014 | A1 | 4/2010 | Iida et al. |
| 2010/0098840 | A1 | 4/2010 | Du et al. |
| 2010/0101637 | A1 | 4/2010 | Yamasaki et al. |
| 2011/0114170 | A1 | 5/2011 | Lee et al. |
| 2011/0162687 | A1 | 7/2011 | Moon et al. |
| 2012/0031481 | A1 | 2/2012 | Jee et al. |
| 2012/0103409 | A1 | 5/2012 | Kim et al. |

FOREIGN PATENT DOCUMENTS

| | | | |
|---|---|---|---|
| CN | 101359564 | A | 2/2009 |
| EP | 1039568 | | 9/1999 |
| EP | 2325848 | | 5/2011 |
| EP | 2416327 | | 2/2012 |
| EP | 2448003 | | 5/2012 |
| EP | 2450908 | | 5/2012 |
| JP | 62-062870 | | 3/1987 |
| JP | 10040738 | | 2/1998 |
| JP | 10144139 | | 5/1998 |
| JP | 2000-311681 | A | 11/2000 |
| JP | 2002-080902 | A | 3/2002 |
| JP | 2002298651 | | 10/2002 |
| JP | 2003-013103 | A | 1/2003 |
| JP | 2003003246 | | 1/2003 |
| JP | 2004091868 | | 3/2004 |
| JP | 2005050983 | | 2/2005 |
| JP | 2008010527 | | 1/2008 |
| JP | 2009-099371 | A | 5/2009 |
| JP | 2009-138266 | A | 6/2009 |
| JP | 2009197323 | | 9/2009 |
| JP | 2010-018878 | A | 1/2010 |
| JP | 2010133021 | A | 6/2010 |
| JP | 2010199196 | A | 9/2010 |
| KR | 1020020037772 | A | 5/2002 |
| KR | 1020050087249 | | 8/2005 |
| KR | 1020050096258 | | 10/2005 |
| KR | 100677805 | | 1/2007 |
| KR | 1020070106887 | | 11/2007 |
| WO | WO0131085 | | 5/2001 |
| WO | WO-2005/096320 | A2 | 10/2005 |
| WO | WO2005096320 | | 10/2005 |
| WO | WO2009108675 | | 9/2009 |
| WO | WO 2010/033281 | | 3/2010 |

OTHER PUBLICATIONS

Rane et al., "Effect of inorganic binders on the properties of silver thick films", Journal of Materials Science: Materials in Electronics, vol. 15, Issue 2, pp. 103-106 (2004). DOI: 10.1023/B:JMSE.0000005385.21127.ac.*

Busch et al., "Viscosity of the supercooled liquid and relaxation at the glass transition of the Zr46.75Ti8.25Cu7.5Ni10Be27.5 bulk metallic glass forming alloy", Acta Materialia, vol. 46, Issue 13, Aug. 10, 1998, pp. 4725-4732. DOI: 10.1016/S1359-6454(98)00122-0.*

Kuo et al., "Measurement of low-temperature transport properties of Cu-based Cu-Zr-Ti bulk metallic glass", Phys. Rev. B 74, 014208 (2006). DOI: 10.1103/PhysRevB.74.014208.*

Lee et al., "Design of a bulk amorphous alloy containing Cu-Zr with simultaneous improvement in glass-forming ability and plasticity", J. Mater. Res., vol. 22, No. 2, Feb. 2007. DOI: 10.1557/JMR.2007.0063.*

Yi, S. et al. "Ni-based bulk amorphous alloys in the Ni—Ti—Zr—(Si,Sn) system"; Journal of Materials Research, vol. 15, No. 11, p. 2425-2430; Nov. 2000.

Wang, W. "Roles of minor additions in formation and properties of bulk metallic glasses" Progress in Materials Science, vol. 52 p. 540-596; 2007.

US Office Action dated Dec. 10, 2012 corresponding to U.S. Appl. No. 13/016,403.

Partial European Search Report for 10190652.7-2102 dated Mar. 23, 2011.

European Search Report for 11177515.1-1218 dated Feb. 5, 2013.

European Search Report dated Dec. 20, 2011.

Lin et al., "Effect of Ni on glass-forming ability og Cu-Ti-based amorphous alloys", 2006, Transactions of Nonferrous Metals Society of China, 16, pp. 604-606.

Wang X et al.: "Atomic structure and glass formig ability of Cu46Zr46A18 bulk metallic glass", J. Appl. Phys. 104, 093519 (2008).

Arai et al., "Nanocrystal Formation of Metals in Thermally Grown Thin Silicon Dioxide Layer by Ion Implantation and Thermal Diffusion of Implanted Atoms in Heat Treatment", J. Phys. Conf., Ser. 61, 2007; 41-45.

Se Yun Kim et al. "Replacement of oxide glass with metallic glass for Ag screen printing metallization on Si emitter," App. Phys. Lett., Am. Inst. Phys., vol. 98, No. 222112 Jun. 3, 02011).

ASM Handbook. vol. 3 Alloy Phase Diagrams, The Materials Information Soc., Hugh Baker, Ed., ASM International (1992).

Powell et al., Development of metallic glass loaded polymer paste, J. of Materials Processing Tech., 2001, pp. 318-323.

Kim S J et al: "Silver/metallic glass paste for shallow emitter Si-solar cell", 26th European Photovoltaic Solar Energy Conference and Exhibition, Sep. 5-9, 2011, pp. 492-494, XP009160654.

Lee S-W et al: "Design of a bulk amorphous alloy containing Cu-Zr with simultaneous improvement in glass-forming ability and plasticity", Journal of Materials Research, vol. 22, No. 02, Feb. 2007, pp. 486-492, XP55031306.

Kim Y C et al: "Enhanced glass of forming ability and mechanical properties of new Cu-based bulk metallic glasses", Materials Science and Engineering A: Structual Materials: Properties, Microstructure & Processing, Lausanne, CH, vol. 437, No. 2, Nov. 15, 2006, pp. 248-253, XP027953056.

Neuhaus D-H et al: "Industrial Silicon Wafer Solar Cells", Advance in Optoelectronics, vol. 2007, XP 55031298.

(56) References Cited

OTHER PUBLICATIONS

Bashev V F et al: "Crystallization of Al-Ni alloys during rapid cooling", Russian Metallurgy, Allerton Press, Inc, No. 6, 1989, pp. 51-54, XP009160582.
Ivanov E et al: "Synthesis of nickel aluminides by mechanical alloying", Materials Letters, North Holland Publishing Company, Amsterdam, NL, vol. 7, No. 1-2, Aug. 1988, pp. 51-54, XP024149792.
Lim S S et al: "Assessment of the Al-Ag Binary Phase Diagram", CALPHAD, vol. 19, No. 2, 1995, pp. 131-141, XP55017954.
Wang Q et al: "Cluster line criterion and Cu-Zr-Al bulk metallic glass formation", Materials Science and Engineering A: Structural Materials: Properties, Microsturcture & Processing, Lausanne, CH, vol. 449-451, Mar. 19, 2007, pp. 18-23, XP005914563.
Metallurgy Division of the Materials Science and Engineering Laboratory of NIST: "Ag-Cu-Sn System", Aug. 5, 2010, XP55031251, Retrieved from the Internet: http://web.archive.org/web/20100805072225/http://www.metallurgy.nist.gov/phase/solder/agcusn.html.
Oh C-S et al: "A thermodynamic study on the Ag-Sb-Sn system", Journal of alloys and compounds, elsevier sequoia, lausanne, CH, vol. 238, May 1, 1996, pp. 155-166, XP004080478.
Baren M R: "Ag-In (Silver-Indium)" In: White C E T, Okamoto H (Editors): "Phase Diagrams of Indium Alloys and their engineering applications", 1992, ASM International, Materials Park, XP008098250.
Gorshkov N N et al: "Explosive compaction of amorphous Cu-Sn powder prepared by the method of mechanical alloying", Combustion, Explosion, and shock waves, vol. 25, No. 2, 1989, pp. 244-247.
Salkar R A et al: "The sonochemical preparation of amorphous silver nanoparticles", Journal of materials chemistry, vol. 9, No. 6, 1999, pp. 1333-1335.
"Amorphous metal", Wikipedia, Oct. 21, 2010, XP55017848, Retrieved from the internet: URL: http://en.wikipedia.org/w/index.php?title=amorphous_metal&oldid=392080524.
"Electrical resitivity of pure metals" in: "CRC Handbook of chemistry and physics, 77th edition", 1996, CRC Press, Boca raton, New york, London, Tokyo, XP002668350.
US Office Action dated May 15, 2013 corresponding to U.S. Appl. No. 13/016,403.
US Office Action dated Jun. 5, 2013 corresponding to U.S. Appl. No. 12/943,732.
NIST, Properties of Lead-Free Solders, Release 4.0, Feb. 2002.
Notice of Allowance dated Jun. 12, 2013 in U.S. Appl. No. 13/208,705.
Hilali, M. M. et al., Effect of Ag Particle Size in Thick-Film Ag Paste on the Electrical and Physical Properties of Screen Printed Contacts and Silicon Solar Cells, 2006, J. Electrochem. Soc., vol. 153 (1): A5-A11.
Schubert, G. et al., Silver thick film contact formation on lowly doped phosphorous emitters, 2005, Proceedings 20th EPVSEC, Barcelona, pp. 934-937.
US Office Action dated Oct. 8, 2013 corresponding to U.S. Appl. No. 13/281,835.
US Office Action dated Aug. 23, 2013 corresponding to U.S. Appl. No. 13/016,403.
US Office Action dated Oct. 23, 2013 corresponding to U.S. Appl. No. 12/943,732.
Don-Ik Lee, et al., "Effect of TRITONTM X-based Dispersants Bearing a Carboyxlic Terminal Group on Rheological Properties of BAM/Ethyl Cellulose/Terpineol Paste", Journal of Applied Polymer Science, vol. 105, 2012-2019 (2007).
Don-Ik Lee, et al., "Plasma Display Material Prepared from a New Blue Phosphor Dispersion" Journal of Applied Polymer Science, vol. 108, 2571-2577 (2008).
Don-Ik Lee, et al., "Synthesis and Characterization of TRITONTM X-Based Surfactants with Carboxylic or Amino Groups in the Oxyethylene Chain End", Journal of Applied Polymer Science, vol. 104, 162-170 (2007).
M. Chen, "A brief overview of bulk metallic glasses", NPG Asia Materials, vol. 3, Step. 2011, pp. 82-90.
Reda, I.M., et al., "Amorphous Cu-Ag Films With High Stability," International Centre for Theoretical Physics, 1982.
Kenneth Barbalace. Periodic Table of Elements—Sorted by Atomic Radius. EnvironmentalChemistry.com. 1995 http://EnvironmentalChemistry.com/yogi/periodic/atomicradius.html.
US Office Action dated Jan. 31, 2014 corresponding to U.S. Appl. No. 13/348,169.
US Office Action dated Feb. 5, 2014 corresponding to U.S. Appl. No. 13/307,932.
Japanese Office Action dated Apr. 1, 2014 for corresponding application No. JP 2010-252993.
Office Action dated May 1, 2014 for corresponding U.S. Appl. No. 12/943,732.
Office Action dated May 2, 2014 for corresponding U.S. Appl. No. 13/281,835.
Zhang et al. "Thermal and Mechanical Properties of Ti-Ni-Cu-Sn Amorphous Alloys with a Wide Supercooled Liquid Region before Crystallization"; Materials Transactions, vol. 39, p. 1001-1006; 1998.
Chinese Office Action dated Jun. 5, 2014 for corresponding Chinese application No. 201010544709, and English-language translation.
A. Ramirez, et al. "Bonding nature of rare-earth-containing lead-free solders"; Applied Physics Letters, vol. 80, Issue 3, pp. 398-400; Jan. 2002.
A. Rehman, et al. "Review of the Potential of the Ni/Cu Plating Technique for Crystalline Silicon Solar Cells"; Materials, vol. 7, Issue 2, pp. 1318-1341; 2014.
S. Kim, et al. "Capillary flow of amorphous metal for high performance electrode"; Scientific Reports, vol. 3, Article 2185, pp. 1-7; 2013.
Notice of Allowance for corresponding U.S. Appl. No. 13/307,932 dated Sep. 11, 2014.
Notice of Allowance for corresponding U.S. Appl. No. 13/281,835 dated Sep. 25, 2014.
Notice of Allowance for corresponding U.S. Appl. No. 13/348,169 dated Sep. 25, 2014.
Solder, retrieved from http://www.merriam-webster.com/dictionary/solder (Sep. 24, 2014).

* cited by examiner

CONDUCTIVE PASTE AND ELECTRONIC DEVICE AND SOLAR CELL INCLUDING AN ELECTRODE FORMED USING THE CONDUCTIVE PASTE

CROSS-REFERENCE TO RELATED APPLICATION

This application claims priority to Korean Patent Application No. 10-2010-0078343, filed on Aug. 13, 2010, and Korean Patent Application No. 10-2011-0074689, filed on Jul. 27, 2011, and all the benefits accruing therefrom under 35 U.S.C. §119, the contents of which in their entirety are herein incorporated by reference.

BACKGROUND

1. Field

This disclosure relates to a conductive paste, and an electronic device and a solar cell including an electrode formed using the conductive paste.

2. Description of the Related Art

A solar cell is a photoelectric conversion device that transforms solar energy into electrical energy. Solar cells have attracted much attention as a potentially infinite and pollution-free next generation energy source.

A solar cell includes p-type and n-type semiconductors. When an electron-hole pair ("EHP") is produced by light absorbed in a photoactive layer of the semiconductors, the solar cell produces electrical energy by transferring electrons and holes to the n-type and p-type semiconductors, respectively, and then collecting the electrons and holes in electrodes of the solar cell.

A solar cell desirably has as high efficiency as possible for producing electrical energy from solar energy. In order to improve this efficiency, the solar cell desirably absorbs light with minimal loss so that it may produce as many electron-hole pairs as possible, and then collects the produced charges without significant further loss.

An electrode may be fabricated by a deposition method, which requires complicated processes, can have high costs, and can take a long time. Accordingly, a simpler process, such as screen printing a conductive paste including conductive materials has been suggested. However, an electrode formed using a conductive paste may have low conductivity because of a non-electroconductive glass frit included in a conductive paste. Thus there remains a need for an improved conductive paste.

SUMMARY

An embodiment provides a conductive paste which is capable of improving conductivity of an electrode.

Another embodiment provides an electronic device including an electrode formed using the conductive paste.

Yet another embodiment provides a solar cell including an electrode formed using the conductive paste.

According to an embodiment, provided is a conductive paste including a conductive powder, a metallic glass, and an organic vehicle. The metallic glass has a resistivity that decreases more than that of the metallic glass before heat treatment when the metallic glass is subjected to heat treatment at a temperature that is higher than a glass transition temperature of the metallic glass.

Specifically, after the metallic glass is heat treated at a temperature that is higher than a glass transition temperature of the metallic glass, a resistivity of the metallic glass decreases by about 1% to about 95% when compared to the metallic glass before heat treatment.

The metallic glass may be partly crystallized at a temperature that is higher than a glass transition temperature of the metallic glass.

The metallic glass may include at least two elements. A first element of the at least two elements has a highest conductivity of the at least two elements, and the first element of the at least two elements crystallizes before any other element of the at least two elements.

The first element may include silver (Ag), copper (Cu), gold (Au), aluminum (Al), calcium (Ca), beryllium (Be), magnesium (Mg), sodium (Na), molybdenum (Mo), tungsten (W), tin (Sn), zinc (Zn), nickel (Ni), potassium (K), lithium (Li), iron (Fe), palladium (Pd), platinum (Pt), rubidium (Rb), chromium (Cr), strontium (Sr), or a combination thereof.

The metallic glass may have a glass transition temperature of about 100° C. or more.

The conductive powder, the metallic glass, and the organic vehicle may be included in an amount of about 30 to about 99 weight percent (wt %), about 0.1 to about 20 wt %, and about 69 to about 0.9 weight percent, respectively, based on a total weight of the conductive paste.

According to another embodiment, provided is an electronic device including an electrode including the fired conductive paste including a conductive powder, a metallic glass, and an organic vehicle, wherein the metallic glass has a resistivity that decreases more than that of the metallic glass before heat treatment when the metallic glass is heat treated at a temperature that is higher than a glass transition temperature of the metallic glass.

The metallic glass may be partly crystallized at a temperature which is higher than the glass transition temperature of the metallic glass.

The metallic glass may include at least two elements. A first element of the at least two elements may have a highest conductivity of the at least two elements, and the first element may crystallize at a temperature which is lower than a temperature at which any other element of the at least two elements crystallizes.

The first element may include silver (Ag), copper (Cu), gold (Au), aluminum (Al), calcium (Ca), beryllium (Be), magnesium (Mg), sodium (Na), molybdenum (Mo), tungsten (W), tin (Sn), zinc (Zn), nickel (Ni), potassium (K), lithium (Li), iron (Fe), palladium (Pd), platinum (Pt), rubidium (Rb), chromium (Cr), strontium (Sr), or a combination thereof.

In the electronic device, the electrode may include a conductive buffer layer including a crystallized metallic glass, and an electrode portion.

The conductive buffer layer may further include a crystalline conductive powder.

According to another embodiment, a solar cell includes a semiconductor layer, and an electrode electrically connected with the semiconductor layer and including a product of a conductive paste including a conductive powder, a metallic glass, and an organic vehicle, wherein the metallic glass has a resistivity that decreases more than that of the metallic glass before heat treatment when the metallic glass is heat treated at a temperature that is higher than a glass transition temperature of the metallic glass.

The metallic glass may be partly crystallized at a temperature which is higher than the glass transition temperature of the metallic glass.

The metallic glass may include at least two elements, wherein a first element of the at least two elements has a highest conductivity of the at least two elements, and the first element crystallizes at a temperature which is lower than a temperature at which any other element of the at least two elements crystallizes.

The first element may include silver (Ag), copper (Cu), gold (Au), aluminum (Al), calcium (Ca), beryllium (Be), magnesium (Mg), sodium (Na), molybdenum (Mo), tungsten (W), tin (Sn), zinc (Zn), nickel (Ni), potassium (K), lithium (Li), iron (Fe), palladium (Pd), platinum (Pt), rubidium (Rb), chromium (Cr), or strontium (Sr), or a combination thereof.

At least one of the metallic glass and the semiconductor layer may include the conductive power, which diffuses into at least one of the metallic glass and the semiconductor layer at a temperature which is higher than a glass transition temperature of the metallic glass.

In the solar cell, the electrode may include a conductive buffer layer disposed at a region which is adjacent to the semiconductor layer and including a crystallized metallic glass, and an electrode portion which is disposed at a region except the buffer layer.

The conductive buffer layer may further include a crystalline conductive particle disposed in the crystallized metallic glass.

BRIEF DESCRIPTION OF THE DRAWINGS

The above and other embodiments, advantages and features of this disclosure will become more apparent by describing in further detail exemplary embodiments thereof with reference to the accompanying drawings, in which.

DETAILED DESCRIPTION

Exemplary embodiments will hereinafter be described in further detail with reference to the accompanying drawings, in which various embodiments are shown. This disclosure may, however, be embodied in many different forms and should not be construed as limited to the exemplary embodiments set forth herein.

As used herein, the term "and/or" includes any and all combinations of one or more of the associated listed items. It will be understood that, although the terms "first," "second," "third" etc. may be used herein to describe various elements, components, regions, layers, and/or sections, these elements, components, regions, layers, and/or sections should not be limited by these terms. These terms are only used to distinguish one element, component, region, layer, or section from another element, component, region, layer, or section. Thus, "a first element," "component," "region," "layer," or "section" discussed below could be termed a second element, component, region, layer, or section without departing from the teachings herein.

The terminology used herein is for the purpose of describing particular embodiments only and is not intended to be limiting. As used herein, the singular forms "a," "an" and "the" are intended to include the plural forms as well, unless the context clearly indicates otherwise. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

"Alkyl" means a straight or branched chain saturated aliphatic hydrocarbon having 1 to 12 carbon atoms, more specifically 1 to 6 carbon atoms.

Hereinafter, the term 'element' refers to a metal and a semimetal.

First, disclosed is a conductive paste.

The conductive paste according to an embodiment includes a conductive powder, a metallic glass, and an organic vehicle.

The conductive powder may include an aluminum (Al)-containing metal such as aluminum or an aluminum alloy, a silver (Ag)-containing metal such as silver or a silver alloy, a copper (Cu)-containing metal such as copper (Cu) or a copper alloy, a nickel (Ni)-containing metal such as nickel (Ni) or a nickel alloy, or a combination thereof. However, the conductive powder is not limited thereto and may include other metals, an additive, or a combination thereof. In an embodiment the conductive powder is copper. In another embodiment the conductive powder is a copper alloy. In yet another embodiment, the conductive powder is a combination of copper and a copper alloy. The conductive powder may also be silver, a silver alloy, or a combination of silver and a silver alloy.

The conductive powder may have a size (e.g., average largest particle size) ranging from about 1 nanometers (nm) to about 50 micrometers (μm), specifically about 0.1 μm to about 50 μm, more specifically about 0.5 μm to about 40 μm, further specifically about 1 μm to about 30 μm. Particles of the conductive powder may have an irregular, spherical, rod-like, or plate-like shape.

The metallic glass includes an alloy having a disordered atomic structure including two or more elements. The metallic glass may be an amorphous metal. The metallic glass may have about 50 to about 99.9 weight percent ("wt %"), specifically about 60 to about 99 wt %, more specifically about 70 to about 95 wt % amorphous content, based on a total weight of the metallic glass. In an embodiment, the metallic glass may comprise about 1 to 50 wt %, specifically about 2 to 40 wt %, more specifically about 4 to about 30 wt % crystalline content, based on a total weight of the metallic glass.

The metallic glass has low resistance, unlike an insulating glass such as silicate, and thus has sufficient conductivity to be considered a conductor. Specifically, the metallic glass may have a resistivity of about 1 to about 1000 microohm-centimeters (μΩcm), specifically about 5 to about 800 μΩcm, more specifically about 10 to about 600 μΩcm. Also, a resistivity of the metallic glass decreases when the metallic glass is heat treated at a temperature that is higher than a glass transition temperature of the metallic glass. The temperature that is higher than a glass transition temperature of the metallic glass may be about 1 to about 300° C., specifically about 5 to about 250° C., more specifically about 10 to about 200° C. higher than the Tg of the metallic glass.

For example, when heat treated at a temperature of about 400 to about 800° C., specifically about 500 to about 700° C., more specifically at about 600° C., the resistivity of the metallic glass may decrease by about 1 to about 200 μΩcm, specifically about 5 to about 150 μΩcm, more specifically about 10 to about 100 μΩcm, or about 20 to about 75 μΩcm.

Because the metallic glass has a low resistance and is distinct from an insulating glass such as a silicate, it may be considered to be an electrical conductor at a voltage and at a current of a solar cell.

The metallic glass may have a resistivity that decreases more than that of the metallic glass before heat treatment when the metallic glass is heat treated at a temperature that is higher than a glass transition temperature of the metallic glass. Specifically, after the metallic glass is heat treated at a temperature that is higher than a glass transition temperature of the metallic glass, a resistivity of the metallic glass decreases by about 1% to about 95% when compared to the metallic glass before heat treatment. More specifically, after the metallic glass is heat treated at a temperature that is higher than a glass transition temperature of the metallic glass, a resistivity of the metallic glass decreases by about 10% to about 60% when compared to the metallic glass before heat treatment.

A glass transition temperature of the metallic glass may be, for example, about 100° C. or more, specifically about 150° C. or more, more specifically about 200° C. or more. In an embodiment, the glass transition temperature may be about 100 to about 700° C., specifically about 150 to about 650° C., more specifically about 200 to about 600° C. A first temperature may be higher than the glass transition temperature of the metallic glass and may be between the glass transition temperature ("Tg") of a metallic glass and a crystallization temperature ("Tc") of the metallic glass. The crystallization temperature may be about 120 to about 720° C., specifically about 170 to about 670° C., more specifically about 220 to about 620° C.

The metallic glass is plastically deformed at the first temperature, which is higher than the glass transition temperature of the metallic glass. At the first temperature, the metallic glass shows liquid-like behavior. On the other hand, when the metallic glass is maintained for a selected time at the first temperature, which is higher temperature than the glass transition temperature, the metallic glass may slowly crystallize at a temperature which is lower than its crystallization temperature ("Tc") to form a partially crystalline material. Accordingly, at least the metallic glass may be partly crystallized at a temperature which is higher than the glass transition temperature of the metallic glass, e.g., the first temperature.

If the element of the conductive paste having the highest conductivity is not the first component of the metallic glass to crystallize, that element may undesirably oxidize. Also, if the undesirably formed oxide is included in the metallic glass, properties of the metallic glass, such as its conductivity, may be undesirably reduced.

Herein, an element with the highest conductivity of at least two elements included in the metallic glass, or its alloy, may be first crystallized. The element having the highest conductivity may include, for example, silver (Ag), copper (Cu), gold (Au), aluminum (Al), calcium (Ca), beryllium (Be), magnesium (Mg), sodium (Na), molybdenum (Mo), tungsten (W), tin (Sn), zinc (Zn), nickel (Ni), potassium (K), lithium (Li), iron (Fe), palladium (Pd), platinum (Pt), rubidium (Rb), chromium (Cr), strontium (Sr), or a combination thereof.

For example, when a metallic glass is an alloy including copper (Cu), zirconium (Zr), aluminum (Al), silver (Ag), nickel (Ni), and titanium (Ti), copper (Cu), which is the element with the highest conductivity, or copper-zirconium alloy (CuZr), which is a copper (Cu) alloy, may be first crystallized. Alternatively, if copper (Cu), as the element with the highest conductivity, is oxidized into a copper oxide before crystallization, it may be crystallized as an oxide, thus undesirably increasing a resistivity of a metallic glass and thus, decreasing its conductivity.

Accordingly, a metallic glass according to an embodiment may have a lower resistivity and an improved conductivity after the heat treatment because the element with the highest conductivity, or its alloy, of the components of the metallic glass is the first crystallized component of the component elements of the metallic glass.

The organic vehicle may include an organic, an optional organic solvent, and optional additives known for use in the manufacture of conductive pastes for solar cells. The organic vehicle is combined with the conductive powder and the metallic glass primarily to provide a viscosity rheology to the conductive paste effective for printing or coating the conductive. A wide variety of inert organic materials can be used, and can be selected by one of ordinary skill in the art without undue experimentation to achieve the desired viscosity and rheology, as well as other properties such as dispersibility of the conductive powder and the metallic glass, stability of conductive powder and the metallic glass and any dispersion thereof, drying rate, firing properties, and the like. Similarly, the relative amounts of the organic compound, any optional organic solvent, and any optional additive can be adjusted by one of ordinary skill in the art without undue experimentation in order to achieve the desired properties of the conductive paste.

The organic compound may be, for example, a polymer such as a C1 to C4 alkyl(meth)acrylate-based resin; a cellulose such as ethyl cellulose or hydroxyethyl cellulose; a phenol resin; a wood rosin; an alcohol resin; a halogenated polyolefin such as tetrafluoroethylene (e.g., TEFLON); the monobutyl ether of ethylene glycol monoacetate, or the like, or a combination thereof.

The organic vehicle may further optionally include an additive such as a surfactant, a thickener, a stabilizer, or a combination thereof.

The solvent may be any solvent which is capable of dissolving or suspending the above components of the conductive paste, and may be for example terpineol, butylcarbitol, butylcarbitol acetate, pentanediol, dipentyne, limonene, an ethyleneglycol alkylether, a diethyleneglycol alkylether, an ethyleneglycol alkylether acetate, a diethyleneglycol alkylether acetate, a diethyleneglycol dialkylether acetate, a triethyleneglycol alkylether acetate, a triethylene glycol alkylether, a propyleneglycol alkylether, propyleneglycol phenylether, a dipropyleneglycol alkylether, a tripropyleneglycol alkylether, a propyleneglycol alkylether acetate, a dipropyleneglycol alkylether acetate, a tripropyleneglycol alkyl ether acetate, dimethylphthalic acid, diethylphthalic acid, dibutylphthalic acid, desalted water, or the like, or a combination thereof.

The conductive powder, the metallic glass, and the organic vehicle may be included in an amount of about 30 to about 99 weight percent (wt %), about 0.1 to about 20 wt %, and about 69 to about 0.9 wt %, specifically about 40 to about 95 wt %, about 1 to about 20 wt %, and 59 to about 4 wt %, more specifically about 50 to about 90 wt %, about 2 to about 20 wt %, and about 48 to about 8 wt %, respectively, based on the total amount of the conductive paste.

The aforementioned conductive paste may be disposed by screen-printing to provide an electrode for an electronic device.

FIGS. 1 to 4C show changes of the conductive paste which may occur upon heat treatment.

Figure 1:
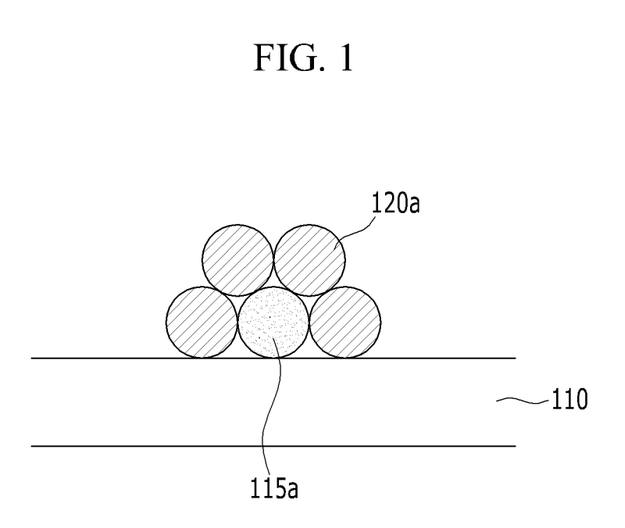
FIGS. 1 to 3 are schematic diagrams showing an embodiment of heat treating a conductive paste disposed on a semiconductor substrate wherein a metallic glass is transformed and contacts the semiconductor substrate.
Figure 2:
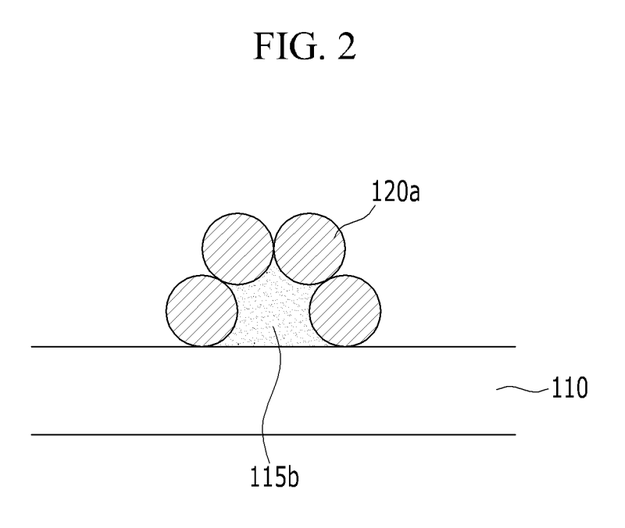
Figure 3:
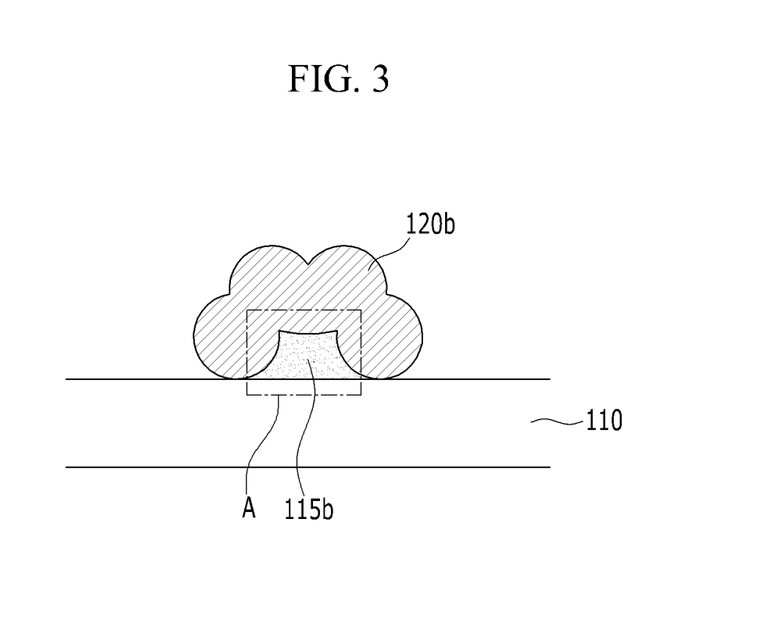
Figure 4A:
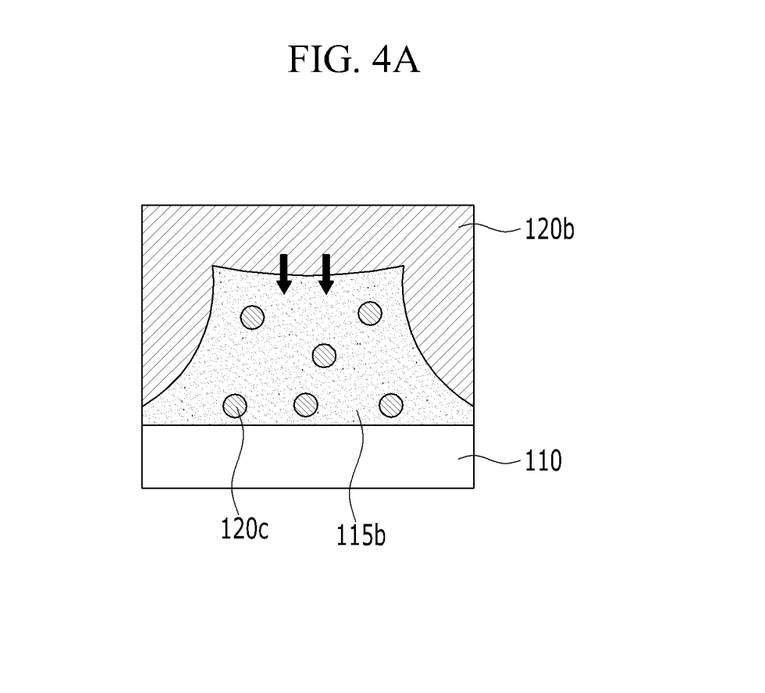
FIGS. 4A to 4C are schematic diagrams of region A of FIG. 3.
Figure 4B:
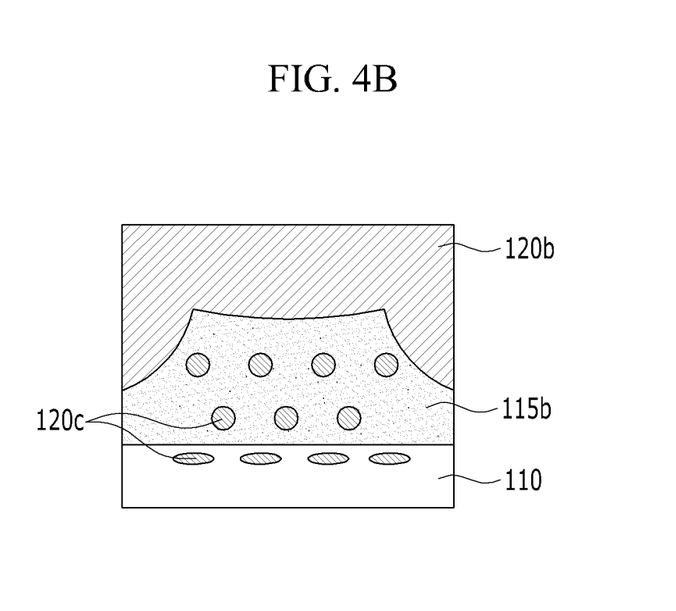
Figure 4C:
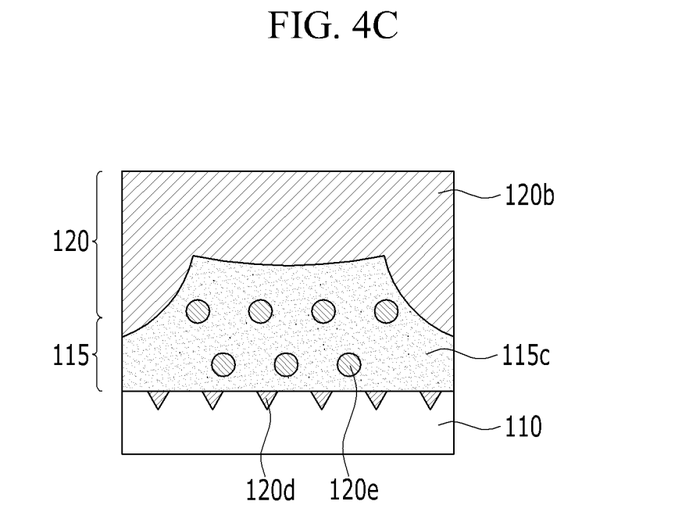

FIGS. 1 to 3 are schematic diagrams showing that when a conductive paste including a metallic glass is disposed on a semiconductor substrate and is heat treated (e.g., fired), the metallic glass deforms and contacts the semiconductor substrate and the conductive powder of the conductive paste. FIGS. 4A to 4C are schematic diagrams enlarging a region A of FIG. 3.

Referring to FIG. 1, a conductive paste including a conductive powder 120a and a metallic glass 115a is applied on a semiconductor substrate 110. The conductive powder 120a and the metallic glass 115a may each have the form of a particle having a spherical shape, for example.

Referring to FIG. 2, when the metallic glass 115a is heat-treated at a first temperature, which is higher than a glass transition temperature ("Tg") of the metallic glass, the metallic glass 115a is thermally deformed and turns into a softened metallic glass 115b which shows liquid-like behavior. The first temperature may be about 1 to about 300° C., specifically about 5 to about 250° C., more specifically about 10 to about 200° C. higher than the Tg of the metallic glass. The softened metallic glass 115b may fill a gap among a plurality of particles of the conductive powder 120a and may wet the metal particles of the conductive powder 120a, and thus may form a layer on the surface of the metal particles of the conductive powder 120a. Herein, because the metallic glass 115a has a glass transition temperature ("Tg") which is lower than the sintering temperature of the conductive powder 120a, the metallic glass 115a becomes soft before the conductive powder 120a is sintered. Meanwhile, the metallic glass 115a would be at least partly crystallized.

The softened metallic glass 115b spreads on (e.g., wets) the semiconductor substrate 110. The softened metallic glass 115b may wet a large region of the semiconductor substrate 110. In the wetted region, e.g., in a region where the softened metallic glass 115b contacts the semiconductor substrate 110, the conductive powder may permeate into the semiconductor substrate 110 at a second temperature, which is further described below. Accordingly, the better the wetting properties of a metallic glass, the more contact a resulting electrode (which may be formed by heat treating the conductive paste) has with the semiconductor substrate, thereby improving adhesion between the electrode and the semiconductor substrate. In addition, a metallic glass with improved wettability may enlarge a path for charges produced in the semiconductor substrate by solar light to move into the electrode, thereby improving an efficiency of a solar cell.

Referring to FIG. 3, when a conductive paste is heat-treated at a second temperature, which is higher than a sintering temperature ("Ts") of the conductive powder 120a, particles of the conductive powder 120a may be sintered and closely bonded with neighboring particles of the conductive powder 120a to form a conductive powder agglomerate 120b. The second temperature may be about 1 to about 300° C., specifically about 5 to about 250° C., more specifically about 10 to about 200° C. higher than the Ts of the metallic glass.

Referring to FIG. 4A, a conductive particle 120c of the conductive powder agglomerate 120b may diffuse into the softened metallic glass 115b.

Referring to FIG. 4B, when the conductive paste is heated to a third temperature, which is higher than the second temperature, the conductive particle 120c diffuses into the softened metallic glass 115b and permeates into the semiconductor substrate 110. The third temperature may be about 1 to about 300° C., specifically about 5 to about 250° C., more specifically about 10 to about 200° C. higher than the second temperature. Herein, because the softened metallic glass 115b wets the surface of the semiconductor substrate 110, it may enlarge a contact area between the softened metallic glass 115b and the semiconductor substrate 110, and thus provide an area where the conductive particle 120c permeates into the semiconductor substrate 110.

Referring to FIG. 4C, when the semiconductor substrate 110 is cooled down, the conductive particle 120c which is permeated into the semiconductor substrate 110 may crystallize to form conductive particle 120d at or near the surface of the semiconductor substrate 110. Also, the softened metallic glass 115b may crystallize (or may partially crystallize) to form a crystallized metallic glass 115c. The conductive particle 120c of the metallic glass may also crystallize to form a crystalline conductive particle 120e.

Accordingly, an electrode portion 120 including the conductive powder agglomerate 120b is formed and a conductive buffer layer 115 including the crystallized metallic glass 115c and the crystalline conductive particle 120e is formed between the electrode portion 120 and the semiconductor substrate 110. In other words, an electrode which may include an electrode portion 120 and a conductive buffer layer 115 disposed between the electrode portion 120 and the semiconductor substrate 110, is formed.

FIG. 4C shows that the conductive buffer layer 115 is formed on the semiconductor layer 110, but is not limited thereto. The conductive buffer layer 115 may be omitted, or may be formed on a part of the semiconductor layer 110.

The conductive buffer layer 115 includes the crystallized metallic glass 115c and the crystalline conductive particle 120e as aforementioned. While not wanting to be bound by theory, it is believed that because the crystallized metallic glass 115c contacts the semiconductor substrate 110 and the conductive powder agglomerate 120b of the electrode portion 120, the conductive buffer layer 115 provides improved conductivity without increasing a contact resistance between the electrode portion 120 and the semiconductor substrate 110. Furthermore, as is further described above, when the metallic glass is crystallized, a element with the highest conductivity of the components of the metallic glass, or its alloy, is first crystallized, further improving conductivity.

When the electronic device is a solar cell, a crystalline conductive particle 120e in the conductive buffer layer 115 and the conductive particle 120d of the semiconductor substrate 110 may effectively improve transfer of charges produced in the semiconductor substrate 110 to the electrode portion 120 and simultaneously reduce a contact resistance between the semiconductor substrate 110 and the electrode portion 120, thereby decreasing charge loss of the solar cell. Ultimately, the solar cell may have improved efficiency.

Figure 5:
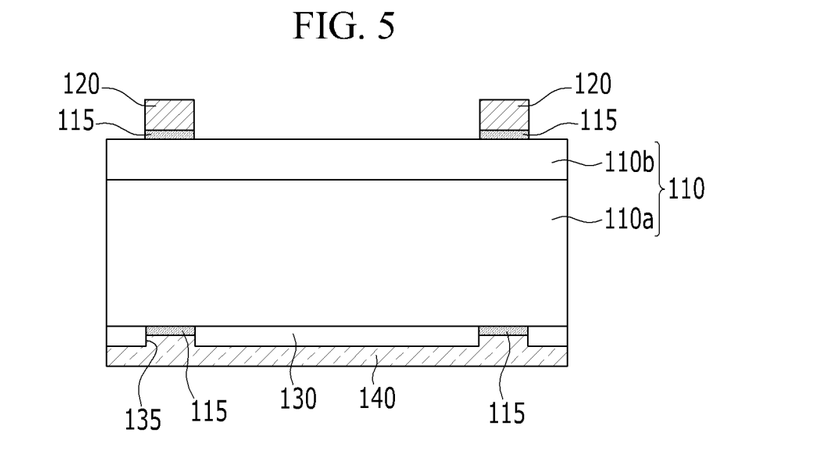
FIG. 5 is a cross-sectional view of an embodiment of a solar cell.

Referring to FIG. 5, as an example of the electronic device, a solar cell is described in further detail.

FIG. 5 is a cross-sectional view of an embodiment of a solar cell.

In the drawings, the thickness of layers, films, panels, regions, etc., are exaggerated for clarity. Like reference numerals designate like elements throughout the specification. It will be understood that when an element such as a layer, film, region, or substrate is referred to as being "on" another element, it can be directly on the other element or intervening elements may also be present. In contrast, when an element is referred to as being "directly on" another element, there are no intervening elements present.

Hereinafter, positions of (or spatial relationships between) components will be described with respect to a semiconductor substrate 110 for better understanding and ease of description, but the disclosed embodiment is not limited thereto. In addition, for clarity of description, a solar energy incident side of a semiconductor substrate 110 is called a front side, and the opposite side is called a rear side, although alternative configurations are possible.

Referring to FIG. 5, a solar cell according to an embodiment includes a semiconductor substrate 110 including a lower semiconductor layer 110a and an upper semiconductor layer 110b.

The semiconductor substrate 110 may comprise a crystalline silicon or a compound semiconductor. The crystalline silicon may be, for example, a silicon wafer. One of the lower semiconductor layer 110a and the upper semiconductor layer 110b may be a semiconductor layer doped with a p-type impurity, and the other may be a semiconductor layer doped with an n-type impurity. For example, the lower semiconductor layer 110a may be a semiconductor layer doped with a p-type impurity, and the upper semiconductor layer 110b may be a semiconductor layer doped with an n-type impurity. Herein, the p-type impurity may be a Group III element such as boron (B), and the n-type impurity may be a Group V element such as phosphorus (P).

The surface of the upper semiconductor layer 110b may be textured, for example by surface texturing. The surface-textured upper semiconductor layer 110b may have protrusions and depressions, and may comprise a pyramidal shape, or may have a porous structure having a honeycomb shape, for example. The surface-textured upper semiconductor layer 110b may have an enhanced surface area to improve the light-absorption rate and decrease reflectivity, thereby improving efficiency of a solar cell.

An anti-reflection coating (not shown) may be disposed on the surface-textured upper semiconductor layer 110b.

A front electrode may be disposed on the upper semiconductor layer 110b. The front electrode may be arranged in parallel to a direction of the substrate, and may have a grid pattern shape to reduce a shadowing loss and/or a sheet resistance.

The front electrode may include a conductive buffer layer 115 disposed at a region which is adjacent to the upper semiconductor layer 110b, and a front electrode portion 120 disposed at a region except the conductive buffer layer 115. FIG. 5 shows that the conductive buffer layer 115 is formed, but is not limited thereto. The conductive buffer layer 115 may be omitted, or may be formed on a part of a region which is adjacent to the upper semiconductor layer 110b.

The front electrode may be disposed by a screen printing a conductive paste. The conductive paste may be the same as described above.

The front electrode portion 120 may include a conductive material, for example a low resistance conductive material such as silver (Ag).

A conductive buffer layer 115 is disposed between the upper semiconductor layer 110b and the front electrode portion 120 by heat treating the conductive paste disposed to form the front electrode. The conductive buffer layer 115 may be conductive due to inclusion of the metallic glass. Because the conductive buffer layer 115 has portions that contact the electrode portion 120 and the upper semiconductor layer 110b, it may decrease loss of electric charges by enlarging the effective or actual path for transferring electric charges between the upper semiconductor layer 110b and the front electrode portion 120. The buffer layer may also reduce resistive losses, for example.

The metallic glass of the conductive buffer layer 115 is derived from the conductive paste used to form the front electrode portion 120. The metallic glass may be softened before the conductive material for the front electrode portion 120 during processing, so that the metallic glass is disposed under the front electrode portion 120 to form the buffer layer.

A bus bar electrode (not shown) may be disposed on the front electrode portion 120. The bus bar electrode can connect adjacent solar cells of a plurality of solar cells.

A dielectric layer 130 may be disposed under the semiconductor substrate 110, e.g., on the lower semiconductor layer 110a. The dielectric layer 130 may increase efficiency of a solar cell by substantially or effectively preventing recombination of electric charges and leaking of electric current. The dielectric layer 130 may include a penetration part 135 (e.g., a through hole), and the semiconductor substrate 110 and a rear electrode 140, that will be further described below, may contact through the penetration part 135.

The dielectric layer 130 may comprise silicon oxide ($SiO_2$), silicon nitride ($SiN_x$), aluminum oxide ($Al_2O_3$), or a combination thereof, and may have a thickness of about 100 Å to about 2000 angstroms (Å), specifically about 200 Å to about 1800 Å, more specifically about 300 Å to about 1600 Å. The dielectric layer 130 may be omitted.

A rear electrode is disposed under the dielectric layer 130, e.g., on the dielectric layer 130. The rear electrode may include a conductive material, and the conductive material may be an opaque metal such as aluminum (Al). The rear electrode may be disposed by screen printing a conductive paste in the same manner as is disclosed for the front electrode.

In an embodiment, the rear electrode may include a conductive buffer layer 115 disposed at a region which is adjacent to the lower semiconductor layer 110a, and a rear electrode portion 140 disposed at a region except the conductive buffer layer in the same manner as is disclosed for the front electrode. FIG. 5 shows that the conductive buffer layer 115 is formed, but is not limited thereto. The conductive buffer layer 115 may be omitted, or may be formed on a part of a region which is adjacent to the lower semiconductor layer 110a.

In another embodiment, the buffer layer 115 is disposed between the rear electrode portion 140 and the lower semiconductor layer 110a or between the front electrode portion 120 and the upper semiconductor layer 110b.

Hereinafter, a method of manufacturing the solar cell is further described with reference to FIG. 5.

First, a semiconductor substrate 110, such as a silicon wafer, is prepared. The semiconductor substrate 110 may be doped with an impurity, such as a p-type impurity, for example.

Then the semiconductor substrate 110 may be subjected to a surface texturing treatment. The surface-texturing treatment may be performed by a wet method using a strong acid such as nitric acid, hydrofluoric acid, or the like, or a combination thereof, or a strong base such as sodium hydroxide; or the surface-texturing treatment may be performed by a dry method such as plasma treatment.

Then, the semiconductor substrate 110 may be doped with an n-type impurity, for example. The n-type impurity may be doped by diffusing $POCl_3$, $H_3PO_4$, or the like, or a combination thereof, at a high temperature, for example at about 750° C. to about 1100° C. Thus, the semiconductor substrate 110 includes a lower semiconductor layer 110a and an upper semiconductor layer 110b doped with different impurities than each other.

Then a conductive paste for a front electrode is applied on the upper semiconductor layer 110b. The conductive paste for a front electrode may be provided by a screen printing method. The screen printing method includes applying the conductive paste, which comprises a conductive powder, a metallic glass, and an organic vehicle at a location where a front electrode is disposed, and drying the same.

As further disclosed above, the conductive paste may include a metallic glass, and the metallic glass may be prepared using any suitable method such as melt spinning, infiltration casting, gas atomization, ion irradiation, or mechanical alloying.

Then the conductive paste for a front electrode may be dried.

A dielectric layer 130 may be provided by disposing (e.g., stacking, forming, or depositing) aluminum oxide ($Al_2O_3$) or silicon oxide ($SiO_2$) on an entirety of or on a portion of a rear side of the semiconductor substrate 110. The dielectric layer 130 may be disposed by a plasma enhanced chemical vapor deposition ("PECVD") method, for example.

Then a penetration part 135 may be provided on a portion of the dielectric layer 130 by ablation with a laser, for example. The dielectric layer 130 and the penetration part 135 may be omitted.

The conductive paste for a rear electrode is subsequently applied on a side of the dielectric layer 130, which in an embodiment is opposite the semiconductor substrate 110, by a screen printing method.

The conductive paste for a rear electrode is then dried.

Next, the conductive paste for a front electrode and the conductive paste for a rear electrode are co-fired (e.g., heat treated), or fired individually. Alternatively, the conductive paste for a front electrode and the conductive paste for a rear electrode may be fired in separate processes. Thus the conductive paste for a front electrode and the conductive paste for a rear electrode may be fired in the same or in different processes.

The firing may be performed in a furnace and at a temperature which is higher than the melting temperature of the conductive metal, for example at a temperature ranging from about 200° C. to about 1000° C., specifically about 400° C. to about 1000° C., more specifically about 450° C. to about 950° C., further specifically about 500° C. to about 900° C.

Hereinafter, a solar cell according to another embodiment is disclosed referring to FIG. 6.

Figure 6:
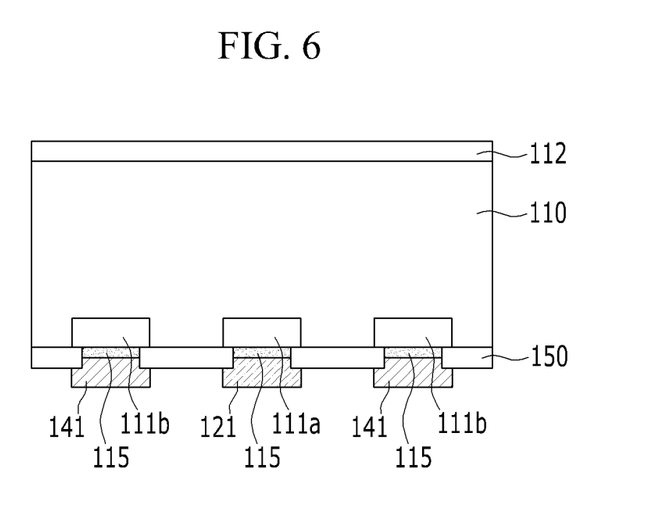
FIG. 6 is a cross-sectional view of another embodiment of a solar cell.

FIG. 6 is a cross-sectional view showing a solar cell according to another embodiment.

A solar cell may include a semiconductor substrate 110 doped with a p-type or an n-type impurity. The semiconductor substrate 110 may include a first doping region 111a and second doping region 111b that are provided on the rear side of the semiconductor substrate 110, and are doped with different impurities than each other. For example, the first doping region 111a may be doped with an n-type impurity, and the second doping region 111b may be doped with a p-type impurity. The first doping region 111a and the second doping region 111b may be alternately disposed on the rear side of the semiconductor substrate 110.

The front side of the semiconductor substrate 110 may be surface-textured, and therefore may enhance the light-absorption rate and decrease the reflectivity of the solar cell, thereby improving efficiency of the solar cell. An insulation layer 112 is provided on the semiconductor substrate 110. The insulation layer 112 may comprise an insulating material that is substantially transparent and thus absorbs little light, for example silicon nitride ($SiN_x$), silicon oxide ($SiO_2$), titanium oxide ($TiO_2$), aluminum oxide ($Al_2O_3$), magnesium oxide (MgO), cerium oxide ($CeO_2$), or the like, or a combination thereof. The insulation layer 112 may be a single layer or more than one layer. The insulation layer 112 may have a thickness ranging from about 200 Å to about 1500 Å, specifically 300 Å to about 1400 Å, more specifically about 400 Å to about 1300 Å.

The insulation layer 112 may be an anti-reflective coating ("ARC") that decreases the reflectivity of light and increases selectivity of a particular wavelength region on the surface of the solar cell, and simultaneously improves contact properties of silicon at the surface of the semiconductor substrate 110, thereby increasing efficiency of the solar cell.

A dielectric layer 150 including first and second penetration parts may be disposed on the rear side of the semiconductor substrate 110.

The first electrode electrically connected with the first doping region 111a and the second electrode electrically connected with the second doping region 111b are disposed on the rear side of the semiconductor substrate 110, respectively. The first electrode and the first doping region 111a may be contacted through the first penetration part, and the second electrode and the second doping region 111b may be in contact through the second penetration part. The front electrode and the rear electrode may be alternately disposed.

The first electrode may include a conductive buffer layer 115 disposed at a region which is adjacent to the first doping region 111a, and a first electrode portion 121 disposed at a region except the conductive buffer layer 115, and the second electrode may include a conductive buffer layer 115 disposed at a region which is adjacent to the second doping region 111b, and a second electrode portion 141 disposed at a region except the conductive buffer layer 115. However, they are not limited thereto. The buffer layer 115 may be omitted, or may be formed on a part of region being adjacent to the first doping region 111a, a part of region being adjacent to the second doping region 111b, or a combination thereof.

As disclosed in the above embodiment, the first electrode and the second electrode are formed using a conductive paste including a conductive powder, a metallic glass, and an organic vehicle, which may be the same as described above.

A conductive buffer layer 115 is disposed between the first doping region 111a and the first electrode portion 121, and between the second doping region 111b and the second electrode portion 141. The conductive buffer layer 115 may be electrically conductive due to inclusion of a metallic glass. Because the conductive buffer layer 115 includes portions contacting either the first electrode portion 121 or the second electrode portion 141, and portions contacting either the first doping region 111a or the second doping region 111b, respectively, loss of electric charge may be decreased by enlarging or otherwise improving the path for transferring electric charge between the first doping region 111a and the first electrode portion 121, or between the second doping region 111b and the second electrode portion 141. In addition, the conductive buffer layer 115 may substantially or effectively prevent a material of the first electrode portion 121 or the second electrode portion 141 from diffusing into the first or second doping region 111a or 111b, respectively.

A solar cell according to the embodiment including both of the first electrode and the second electrode on the rear surface of the solar cell may decrease an area where a metal is disposed on the front surface. This may decrease shadowing loss and increase solar cell efficiency.

Hereinafter, the method of manufacturing a solar cell will be further disclosed referring to FIG. 6.

First, a semiconductor substrate 110 doped with, for example, an n-type impurity is prepared. Then, the semiconductor substrate 110 is surface-textured, and an insulation layer 112 and a dielectric layer 150 are disposed on a front side and a rear side of the semiconductor substrate 110, respectively. The insulation layer 112 and the dielectric layer 150 may be formed by chemical vapor deposition ("CVD"), for example.

Then, the first doping region 111a and the second doping region 111b may be formed by sequentially doping a p-type impurity and an n-type impurity at a high concentration, for example at about $10^{16}$ atom/cc to $10^{22}$ atom/cc, in the rear side of the semiconductor substrate 110. Then, a conductive paste for a first electrode is applied on a portion of (e.g., on a side of) the dielectric layer 150 corresponding to the first doping region 111a, and a conductive paste for a second electrode is applied on a portion of the dielectric layer 150 corresponding to the second doping region 111b. The conductive paste for the first electrode and the conductive paste for the second electrode may be disposed by screen printing, for example, and the conductive paste may comprise a conductive powder, a metallic glass, and an organic vehicle.

Next, the conductive paste for the first electrode and the conductive paste for the second electrode may be fired together or separately. The firing (e.g., the heat treating) may be performed in a furnace at a temperature which is higher than the melting temperature of a conductive metal. The firing may be performed for 20~300 seconds by a belt furnace whose temperature varied from about 400° C. to about 900° C. gradually.

Use of the aforementioned conductive paste to provide an electrode for a solar cell is illustrated herein, but the utility of the conductive paste is not limited thereto and it may be used to provide an electrode for other electronic devices, such as a plasma display ("PDP"), a liquid crystal display ("LCD"), or an organic light emitting diode ("OLED"), for example.

The following examples illustrate this disclosure in additional detail. However, it is understood that this disclosure shall not limited by these examples.

Preparation of a Metallic Glass

The metallic glasses provided in Table 1 are prepared using a composition including copper (Cu), zirconium (Zr), aluminum (Al), silver (Ag), nickel (Ni), and titanium (Ti).

The resistivities of the metallic glasses are each measured at a room temperature (about 25° C.). The resistivity is measured using a 4-point probe.

Next, the metallic glasses are sharply, for example over about 5° C./second to about 70° C./second, heated up to 600° C. and heat-treated at about 600° C. for about 30 minutes, and then a resistivity of each metallic glass is measured again.

The composition of the metallic glasses, their resistivities at room temperature, and the resistivity changes after the heat treatment are as follows.

TABLE 1

| | | | Resistivity (μΩcm) | |
|---|---|---|---|---|
| Metallic glass | Tg (K) | Tc (K) | Before heat treatment | After heat treatment at 600° C. |
| $Cu_{50}Zr_{50}$ | 697 | 738 | 232 | 167 |
| $Cu_{46}Zr_{46}Al_8$ | 728 | 791 | 207 | 161 |
| $Cu_{58.1}Zr_{35.9}Al_6$ | 764 | 805 | 256 | 192 |
| $Cu_{45}Zr_{45}Ag_{10}$ | 693 | 752 | 195 | 167 |
| $Cu_{43}Zr_{43}Al_7Ag_7$ | 727 | 788 | 218 | 186 |
| $Cu_{34}Zr_{48}Al_8Ag_8Ni_2$ | 718 | 806 | 533 | 456 |
| $Cu_{28}Zr_{48}Al_8Ag_8Ni_8$ | 720 | 781 | 205 | 137 |
| $Cu_{18.7}Zr_{53}Al_{16.3}Ni_{12}$ | 739 | 820 | 268 | 242 |

Referring to Table 1, after the metallic glass including copper (Cu) is heat treated at a temperature that is higher than a glass transition temperature of the metallic glass, a resistivity of the metallic glass including copper (Cu) decreases by about 10% to about 33% when compared to the metallic glass including copper (Cu) before heat treatment.

In the metallic glasses of Table 1, copper (Cu) or an alloy of copper, i.e., copper-zirconium (CuZr), is the metal with the highest conductivity which can be formed by BMG heat-treatment (crystallization). While not wanting to be bound by theory, it believed that because the copper (Cu) or the copper alloy is first crystallized, the metallic glasses have decreased resistivity and improved conductivity.

Preparation of a Conductive Paste

Example 1

A silver (Ag) powder and a metallic glass of the formula $Cu_{43}Zr_{43}Al_7Ag_7$ are added to an organic vehicle including an ethylcellulose binder and a butyl carbitol solvent. Herein, the silver (Ag) powder, the metallic glass $Cu_{43}Zr_{43}Al_7Ag_7$, and the organic vehicle are included in an amount of about 87 wt %, about 4 wt %, and about 9 wt %, respectively, based on the total weight of a conductive paste.

Next, the resulting mixture is kneaded with a 3-roll mill to prepare a conductive paste.

Comparative Example 1

A conductive paste is prepared according to the same method as Example 1 except that a PbO—SiO$_2$-based glass frit is used instead of the metallic glass.

Electrode Fabrication

The conductive pastes according to Example 1 and Comparative Example 1 are each applied on silicon wafers by a screen printing method. Next, the resulting products (i.e., conductive paste printed silicon wafers) are sharply, for example over about 5° C./second to about 70° C./second, heated up to about 600° C. and slowly heated up to about 850° C. using a belt furnace. Then, the heated products are cooled down to form electrodes.

Evaluation

The resistivities and contact resistances of the electrodes using the conductive pastes according to Example 1 and Comparative Example 1 are evaluated. The resistivities are measured using a 4-point probe, and the contact resistances are measured by a transfer length method ("TLM").

The results are provided in Table 2.

TABLE 2

|  | Resistivity ($\Omega$cm) | Contact resistance (m$\Omega$cm$^2$) |
| --- | --- | --- |
| Example 1 | $2.6 * 10^{-6}$ | 33 |
| Comparative Example 1 | $5.41 * 10^{-6}$ | 57 |

As shown Table 2, an electrode using the conductive paste of Example 1 has both improved resistivity and improved contact resistance when compared with an electrode using the conductive paste of Comparative Example 1. The conductive paste of Example 1 provides an electrode that has decreased resistivity after the heat treatment, and thus improved conductivity when compared with the electrode prepared using the conductive paste of Comparative Example 1.

While this disclosure has been described in connection with what is presently considered to be practical exemplary embodiments, it is to be understood that the invention shall not limited to the disclosed embodiments, but, on the contrary, is intended to include various modifications and equivalent arrangements included within the spirit and scope of the appended claims.

What is claimed is:

1. A conductive paste comprising
a conductive powder,
an organic vehicle, and
a metallic glass, the metallic glass being an alloy having a disordered atomic structure that includes at least two elements,
the metallic glass configured to have a resistivity that decreases more than that of the metallic glass before heat treatment when the metallic glass is heat treated at a temperature that is higher than a glass transition temperature of the metallic glass, and the metallic glass being an amorphous metal.

2. The conductive paste of claim 1, wherein the temperature that is higher than a glass transition temperature of the metallic glass is about 1 to about 300° C. higher than the glass transition temperature of the metallic glass.

3. The conductive paste of claim 1, wherein the resistivity is decreased by about 1 to about 200 μ$\Omega$cm.

4. The conductive paste of claim 1, wherein the temperature that is higher than a glass transition temperature of the metallic glass is about 100 to about 800° C.

5. The conductive paste of claim 1, wherein the conductive powder comprises aluminum, silver, copper, or nickel, or a combination thereof.

6. The conductive paste of claim 1, wherein the conductive powder has a particle size of about 1 nm to about 50 micrometers.

7. The conductive paste of claim 1, wherein after the metallic glass is heat treated at a temperature that is higher than a glass transition temperature of the metallic glass, a resistivity of the metallic glass decreases by about 1% to about 95% when compared to the metallic glass before heat treatment.

8. The conductive paste of claim 1, wherein the metallic glass at least partly crystallizes at a temperature that is higher than the glass transition temperature of the metallic glass.

9. The conductive paste of claim 1, wherein
a first element of the at least two elements in the metallic glass has a highest conductivity of the at least two elements, and
the first element of the at least two elements crystallizes before any other element of the at least two elements.

10. The conductive paste of claim 1, wherein
a first element of the at least two elements in the metallic glass has a highest conductivity of the at least two elements, and
the first element crystallizes at a temperature which is lower than a temperature at which any other element of the at least two elements crystallizes.

11. The conductive paste of claim 9, wherein the first element is silver, copper, gold, aluminum, calcium, beryllium, magnesium, sodium, molybdenum, tungsten, tin, zinc, nickel, potassium, lithium, iron, palladium, platinum, rubidium, chromium, or strontium, or a combination thereof.

12. The conductive paste of claim 1, wherein the metallic glass has a glass transition temperature of about 100° C. or more.

13. The conductive paste of claim 1, wherein the metallic glass is substantially amorphous.

14. The conductive paste of claim 1, wherein the conductive powder, the metallic glass, and the organic vehicle are included in an amount of about 30 to about 99 weight percent, about 0.1 to about 20 weight percent, and about 69 to about 0.9 weight percent, respectively, based on a total weight of the conductive paste.

15. An electronic device comprising,
an electrode comprising a product of the conductive paste of claim 1.

16. The electronic device of claim 15, wherein the metallic glass is at least partly crystallized at a temperature which is higher than the glass transition temperature of the metallic glass.

17. The electronic device of claim 15, wherein
a first element of the at least two elements in the metallic glass has a highest conductivity of the at least two elements, and
the first element crystallizes at a temperature which is lower than a temperature at which any other element of the at least two elements crystallizes.

18. The electronic device of claim 17, wherein the first element comprises silver, copper, gold, aluminum, calcium, beryllium, magnesium, sodium, molybdenum, tungsten, tin, zinc, nickel, potassium, lithium, iron, palladium, platinum, rubidium, chromium, or strontium, or a combination thereof.

19. The electronic device of claim 15, wherein the electrode comprises a conductive buffer layer comprising a crystallized metallic glass, and an electrode portion.

20. The electronic device of claim 19, wherein the conductive buffer layer further comprises a crystalline conductive powder.

21. The electronic device of claim 19, wherein the conductive buffer layer comprises a crystallized metallic glass and a crystalline conductive particle disposed in the crystallized metallic glass.

22. The electronic device of claim 19, further comprising a conductive particle disposed in a semiconductor substrate of the electronic device, wherein the semiconductor substrate is disposed on the conductive buffer layer.

23. A solar cell comprising,
a semiconductor layer, and
an electrode electrically connected with the semiconductor layer, the electrode comprising a fired product of the conductive paste of claim 1.

24. The solar cell of claim 23, wherein the metallic glass is at least partly crystallized at a temperature which is higher than the glass transition temperature of the metallic glass.

25. The solar cell of claim 23, wherein
a first element of the at least two elements in the metallic glass has a highest conductivity of the at least two elements, and
the first element crystallizes at a temperature which is lower than a temperature at which any other element of the at least two elements crystallizes.

26. The solar cell of claim 25, wherein the first element comprises silver, copper, gold, aluminum, calcium, beryllium, magnesium, sodium, molybdenum, tungsten, tin, zinc, nickel, potassium, lithium, iron, palladium, platinum, rubidium, chromium, or strontium, or a combination thereof.

27. The solar cell of claim 23, wherein at least one of the metallic glass and the semiconductor layer comprises the conductive powder, which diffuses into at least one of the metallic glass and the semiconductor layer at a temperature which is higher than a glass transition temperature of the metallic glass.

28. The solar cell of claim 23, wherein the electrode comprises a conductive buffer layer disposed at a region which is adjacent to the semiconductor layer and comprising a crystallized metallic glass, and an electrode portion which is disposed at a region except the buffer layer.

29. The solar cell of claim 28, wherein the conductive buffer layer further comprises a crystalline conductive particle disposed in the crystallized metallic glass.

* * * * *

UNITED STATES PATENT AND TRADEMARK OFFICE
CERTIFICATE OF CORRECTION

PATENT NO. : 8,987,586 B2
APPLICATION NO. : 13/206880
DATED : March 24, 2015
INVENTOR(S) : Sang-Soo Jee et al.

It is certified that error appears in the above-identified patent and that said Letters Patent is hereby corrected as shown below:

On the title page item (73)
The correct second Assignee of the invention should read "Industry-Academic Cooperation Foundation, Yonsei University".

Signed and Sealed this
Ninth Day of February, 2016

Michelle K. Lee
*Director of the United States Patent and Trademark Office*